(12) United States Patent
Dotson et al.

(10) Patent No.: US 7,706,136 B1
(45) Date of Patent: Apr. 27, 2010

(54) USB EXPANSION MODULE METHOD AND DESIGN

(75) Inventors: Gary D. Dotson, Muskego, WI (US);
John R. Figie, New Berlin, WI (US);
Shawn D. Cloran, Wauwatosa, WI (US);
Andrew P. Kaufman, Milwaukee, WI (US); Daniel V. Lang, St. Francis, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 305 days.

(21) Appl. No.: 11/421,851

(22) Filed: Jun. 2, 2006

(51) Int. Cl.
*H05K 5/00* (2006.01)
(52) U.S. Cl. .................................. 361/679.01
(58) Field of Classification Search .......... 361/679–686
See application file for complete search history.

(56) References Cited

U.S. PATENT DOCUMENTS

| | | | |
|---|---|---|---|
| 5,579,489 A | 11/1996 | Dornier et al. | |
| 6,128,743 A * | 10/2000 | Rothenbaum | ............... 713/300 |
| 6,145,029 A | 11/2000 | Deschepper et al. | |
| 6,175,789 B1 * | 1/2001 | Beckert et al. | ................. 701/33 |
| 6,872,086 B2 * | 3/2005 | Milan | .......................... 439/131 |
| 6,905,374 B2 * | 6/2005 | Milan | ....................... 439/752.5 |
| 7,039,731 B2 | 5/2006 | Hasegawa | |
| 7,329,152 B2 * | 2/2008 | Mori et al. | .................. 439/638 |
| 2005/0243503 A1 | 11/2005 | Robertson et al. | |
| 2005/0243508 A1 | 11/2005 | Szolyga | |

* cited by examiner

*Primary Examiner*—Javaid Nasri
(74) *Attorney, Agent, or Firm*—Turocy & Watson LLP; Alexander R. Kuszewski; John M. Miller

(57) ABSTRACT

The claimed subject matter provides a system and/or method that facilitates expanding upon an existing universal serial bus (USB). A base component can include a USB host to provide connectivity to at least one device. An expansion module can physically connect in a vertical position to a backside of the base component to provide a replication of the USB host which can allow a device to connect therewith.

28 Claims, 17 Drawing Sheets

USB EXPANSION MODULE METHOD AND DESIGN

TECHNICAL FIELD

The subject invention relates to human machine interfaces (HMIs) and, more particularly, to expanding connectivity related to a universal serial bus (USB).

BACKGROUND

Due to advances in computing technology, businesses today are able to operate more efficiently when compared to substantially similar businesses only a few years ago. For example, internal networking enables employees of a company to communicate instantaneously by email, quickly transfer data files to disparate employees, manipulate data files, share data relevant to a project to reduce duplications in work product, etc. Furthermore, advancements in technology have enabled factory applications to become partially or completely automated. For instance, operations that once required workers to put themselves proximate to heavy machinery and other various hazardous conditions can now be completed at a safe distance therefrom.

Further, imperfections associated with human action have been minimized through employment of highly precise machines. Many of these factory devices supply data related to manufacturing to databases or web services referencing databases that are accessible by system/process/project managers on a factory floor. For instance, sensors and associated software can detect a number of instances that a particular machine has completed an operation given a defined amount of time. Further, data from sensors can be delivered to a processing unit related to system alarms. Thus, a factory automation system can review collected data and automatically and/or semi-automatically schedule maintenance of a device, replacement of a device, and other various procedures that relate to automating a process.

To quickly and easily effectuate control of a system or process within industrial automation environments, equipment manufacturers typically create specialized human-machine interfaces (HMIs) and/or panels that are employed by operators to deliver commands to industrial systems/processes and/or receive data from industrial systems/processes. In other words, HMIs and/or panels provide an essential communication link between operators and automation devices, wherein such HMIs and/or panels enable operators to, among other things, implement and control devices and receive feedback by monitoring device status and health during operation. Without these interfaces, high-level industrial automation would be difficult if not impossible to achieve.

Over time, HMIs and/or panels have undergone several and drastic changes. For instance, a push-button that commissions and de-commissions a machine is a simplest form of a HMI, and these interfaces have been existent for several years. Terminals were later designed that displayed text messages to end users, wherein such messages are indicative of a process performed by a server or processor associated with an automation device. Typically, HMIs and/or panels utilize various expansion models/techniques that utilize some disparate and/or unique connection, wherein such connections can be costly, and inefficient. Moreover, such expansion models/techniques can be oversized, large, and cumbersome.

SUMMARY

The following presents a simplified summary of the claimed subject matter in order to provide a basic understanding of some aspects described herein. This summary is not an extensive overview, and is not intended to identify key/critical elements or to delineate the scope of the claimed subject matter. Its sole purpose is to present some concepts in a simplified form as a prelude to the more detailed description that is presented later.

The subject innovation relates to systems and/or methods that facilitate expanding a base component by leveraging a respective universal serial bus (USB). A base component can include a USB host that provides connectivity for a device. The base component can be expanded upon by implementing a module (also referred to as an expansion module herein). The expansion module can be stacked vertically on a backside of the base component to allow the USB host to be replicated and utilized by an additional device. In addition, the expansion module can be remotely mounted utilizing, for instance, a standard USB cable and mounting such expansion module in a remote location (e.g., a DIN rail). The base component can be, for instance, a base product (e.g., any suitable product employing at least one USB port), a base human machine interface (HMI) terminal, a panel, a panel view, etc. The device can be any suitable USB device, such as, but not limited to, a keyboard, a mouse, an input device, a hard drive, a pen drive, a speaker, a device cable, a battery backup, a media player, a tablet, and any suitable device/component that can employ a USB connection. Moreover, it is to be appreciated that the USB host can be at least one of a standard USB type A, a USBOTG port (e.g., USB On The Go) that includes a host function, USB 1.1, USB 2.0, low speed USB, full speed USB, high speed USB, etc.

Furthermore, the expansion module can leverage the standard USB technology associated with the base component to allow stacking input/output and/or communication modules (e.g., additional devices) by plugging into the base component via the USB host. Thus, the additional device/module and/or USB device can be plugged into the replicated port. By replicating the USB port, future expansion capabilities (e.g., IO/comms/other) can be employed in a low cost product without adding unnecessary costs to the base HMI terminal. Conventional systems and/or methods require an increase in cost based at least in part upon the addition connector; yet the claimed subject matter minimizes expansion costs since the original USB host is the core of the expansion and can be replicated for such expansion.

In accordance with an aspect of the claimed subject matter, at least one of the base component and at least one module can utilize a power management component. The power management component can regulate power consumption of at least one base component and at least one expansion module. Additionally, the power management component can utilize at least one of a USB protocol and a USB driver to ascertain power draw and maintain such draw within a tolerable range. Thus, the combination of the base component and at least one module and/or expansion module can be restricted to a particular power range and/or threshold. The power management component can ascertain the power draw of the combination and then determine whether such draw is within limits and/or determine whether an added device, module, and/or component will place such combination over such limits.

In accordance with another aspect of the innovation described herein, at least one of the base component and at least one module can employ a key mechanism. The key mechanism can maintain power draw for at least one base component and at least one expansion module by employing a physical restraint that prevents stacking at least one of an additional device, and an additional expansion module. The key mechanism can also lock out the at least one base component and at least one expansion module to prevent an increase in power draw. Moreover, such key mechanism can employ a physical restraint on at least one snap-foot to prevent attachment to at least one of the base component and the expansion module. In other aspects of the claimed subject matter, methods are provided that facilitates expanding a base component by leveraging a respective universal serial bus (USB).

To the accomplishment of the foregoing and related ends, certain illustrative aspects of the invention are described herein in connection with the following description and the annexed drawings. These aspects are indicative, however, of but a few of the various ways in which the principles of the invention can be employed and the subject invention is intended to include all such aspects and their equivalents. Other advantages and novel features of the invention will become apparent from the following detailed description of the invention when considered in conjunction with the drawings.

DETAILED DESCRIPTION

Figure 1:
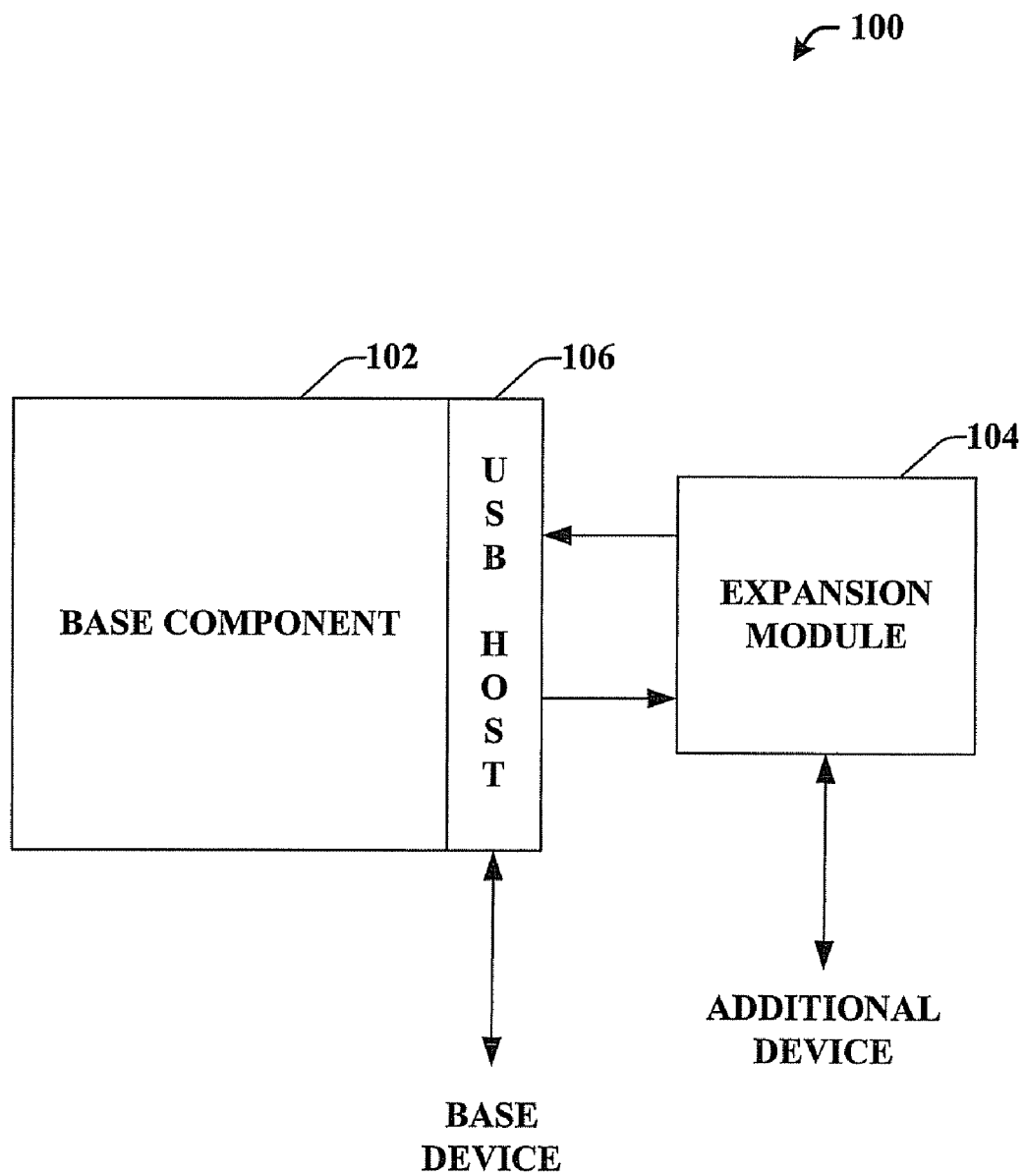
FIG. 1 illustrates a block diagram of an exemplary system that facilitates expanding a base component by leveraging a respective universal serial bus (USB).

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that such matter can be practiced without these specific details. In other instances, well-known structures and devices are shown in block diagram form in order to facilitate describing the invention.

As used in this application, the terms "component" and "system" and the like are intended to refer to a computer-related entity, either hardware, a combination of hardware and software, software, or software in execution. For example, a component may be, but is not limited to being, a process running on a processor, a processor, an object, an instance, an executable, a thread of execution, a program, and/or a computer. By way of illustration, both an application running on a computer and the computer can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter. Moreover, the word "exemplary" is used herein to mean serving as an example, instance, or illustration. Any aspect or design described herein as "exemplary" is not necessarily to be construed as preferred or advantageous over other aspects or designs.

Turning now to the drawings, FIG. 1 illustrates a system 100 that facilitates expanding a base component by leveraging a respective universal serial bus (USB). The system 100 can include a base component 102 with a universal serial bus (USB) host 106 that allows connectivity for a base device. The base component 102 can be, for instance, a base product (e.g., any suitable product employing at least one USB port), a base human machine interface (HMI) terminal, a panel, a panel view, etc. The USB host 106 can provide connectivity to any suitable USB device, such as, but not limited to, a keyboard, a mouse, an input device, a hard drive, a pen drive, a speaker, a device cable, a battery backup, a media player, a tablet, and any suitable device/component that can employ a USB connection. Moreover, it is to be appreciated that the USB host can be at least one of a standard USB type A, a USBOTG port (e.g., USB On The Go) that includes a host function, USB 1.1, USB 2.0, low speed USB, full speed USB, high speed USB, etc.

The system 100 can further include an expansion module 104 that can replicate the USB host 106 to provide modular expansion for an additional device capable of implementing USB connectivity. In other words, the expansion module 104 can leverage the standard USB technology associated with the base component 102 to allow stacking input/output and/or communication modules (e.g., additional devices) by plugging into the base component 102 via the USB host 106. Thus, the additional device/module and/or USB device can be plugged into the replicated port. It is to be appreciated that the system 100 provides a stackable port replicating solution to allow modular expansion, wherein there can be any suitable number of expansion modules 104 daisy-chained implementing any suitable number of additional devices with respective replicated USB ports. Moreover, the expansion modules can be stackable from a single root hub (e.g., USB host 106 associated with the base component 102). In addition, the expansion module 104 can be remotely mounted utilizing, for instance, a standard USB cable and mounting such expansion module 104 in a remote location (e.g., a DIN rail).

For instance, a base HMI terminal can include a USB port (e.g., USB host 106), wherein various USB devices can be employed and/or connected. For instance, a keyboard can be communicatively coupled via the USB port to allow user input. Such base HMI terminal can be expanded and/or enhanced on the backside of the HMI terminal by allowing a vertical stacking of an expansion module, wherein the expansion module can replicate the USB port such that an additional device and/or the originally connected device (e.g., the keyboard in this example) can be communicatively coupled thereto. Thus, the base HMI terminal can be enhanced to provide the USB connection for the keyboard and an additional replicated port for any suitable USB device. In another aspect, the USB host 106 can connect the expansion module 104, wherein the expansion module provide a particular functionality and yet still enables a device to utilize the replicated USB port. By replicating the USB port, future expansion capabilities (e.g., IO/comms/other) can be employed in a low cost product without adding unnecessary costs to the base HMI terminal. Conventional systems and/or methods require an increase in cost based at least in part upon the addition connector; yet the claimed subject matter minimizes expansion costs since the original USB host 106 is the core of the expansion and can be replicated for such expansion.

Furthermore, the system 100 can employ power restrictions/limitations based on the modular expansion (e.g., adding multiple expansion modules, adding the additional devices, combining additional devices/modules utilizing the replicated port solution, etc.). It is to be appreciated that the power restrictions and/or limitations can be computer-based, component based, based on user preference, application usage, environment, etc. In accordance with one aspect of the claimed subject matter, the stacking of certain combinations that exceed the power budget of a single USB host can be prevented and/or limited. For instance, a base component 102 can be expanded with a first expansion module 104 to allow a first additional device to be employed via the replicated USB host 106. Moreover, a second expansion module may be added to connect a second additional device, wherein such device may exceed power limitations. In such a scenario, the second expansion module and second additional device can be denied power in order to remain within power constraints.

Figure 2:
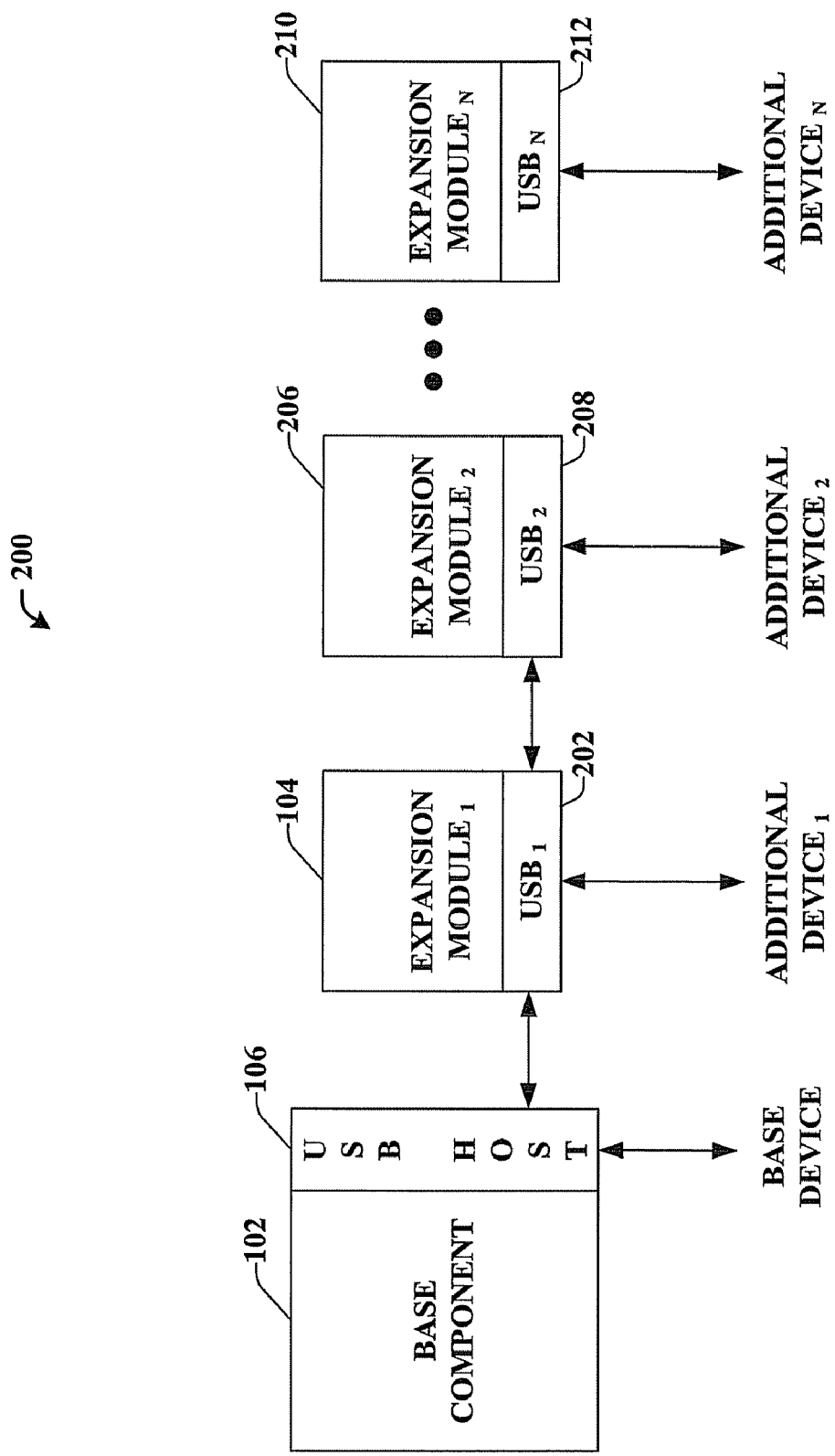
FIG. 2 illustrates a block diagram of an exemplary system that facilitates replicating a base component universal serial bus (USB) port to allow for expansion.

FIG. 2 illustrates a system 200 that facilitates replicating a base component universal serial bus (USB) port to allow for expansion. The system 200 can include the base component 102 with the USB host 106 that can be expanded at least one module that can replicate the USB host 106. Particularly, the expansion module 104 can replicate the USB host 106 such that an additional USB device can be employed. The expansion module 104 can be stacked in a vertical manner on a backside of the base component 102, wherein the replicated USB port (also referred to as a $USB_1$ 202) allows an additional device to be utilized in conjunction with the base component 102 and base device (utilizing the USB host 106). In addition, the expansion module 104 can be remotely mounted utilizing, for instance, a standard USB cable and mounting such expansion module 104 in a remote location (e.g., a DIN rail). Similarly, the expansion module 104 can be modified such that an expansion module$_2$ 206 connects and replicates the $USB_1$ 202 for a $USB_2$ 208 that allows an additional device to be utilized. It is to be appreciated that each expansion module added can replicate the previous USB port in the daisy-chain. For instance, if a base module has a first expansion module, and a second expansion module, the first expansion module replicates the base module USB port, while the second expansion module replicates the first expansion module USB port. In another example, the expansion modules added can replicate the base module USB port for each added expansion module. Moreover, it is to be appreciated that there can be any suitable number of expansion modules from 1 to N, where N is a positive integer.

Figure 3:
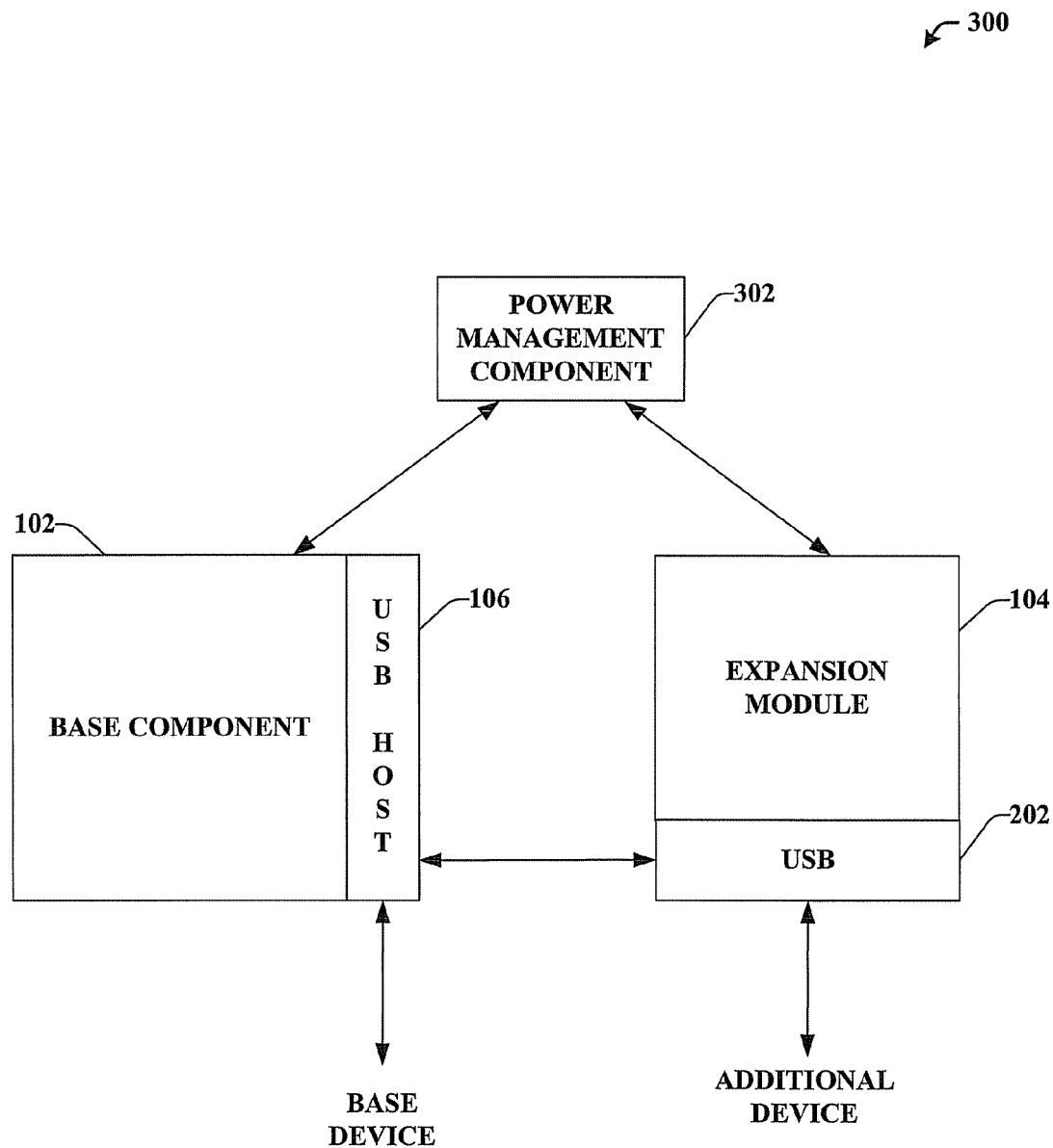
FIG. 3 illustrates a block diagram of an exemplary system that facilitates managing power consumption associated with a base component and an expansion module that leverages universal serial bus (USB) technology related to the base component.

FIG. 3 illustrates a system 300 that facilitates managing power consumption associated with a base component and an expansion module that leverages universal serial bus (USB) technology related to the base component. The base component 102 and respective USB host 106 can be expanded such that the USB host 106 can be replicated by vertically stacking the expansion module 104 on a backside of the base component 102 to allow for an additional device to be employed. In one example, the expansion module 104 can be remotely mounted utilizing, for instance, a standard USB cable and mounting such expansion module 104 in a remote location (e.g., a DIN rail). It is to be appreciated that the expansion module 104 can replicate the USB host 106 in order to provide the expansion module functionality and still provide USB connectivity to a device compatible thereto. In another aspect of the claimed subject matter, the base component 102 can provide USB connectivity to a base device, while the expansion module can connect to the base component 102 via the USB host and replicate such USB mechanisms (depicted by the USB 202) in order to provide USB technology for a disparate additional device.

The system 300 can further include a power management component 302 that can implement various protocols to regulate power consumption for the totality of modules/components. In other words, there can be a power limitation associated with the various USB devices, base components, USB ports, USB compatible devices, and the like, wherein regulation and limitation of such power consumption may be necessary to ensure efficient and proper implementation. The power management component can utilize, for instance, a USB protocol, a USB driver, and/or any other suitable mechanism that ascertains the power draw and maintains such draw within specified restraints between the base component 102 and any additional expansion modules stacked onto the base component 102 (e.g., such as the expansion module 104).

For instance, the power management component 302 can enforce a particular USB protocol/driver that can query the device/module to determine how much power to allow such device/module to draw. A USB driver can query a device to ascertain how much power to allow such device to draw. The USB specification can provide a mechanism in which a device powers up initially at 100 mA and then "requests" to draw more than 100 mA if need be. If the host denies the request, the device should not use more than 100 mA. A driver provision can be made for a USB I/O module drive that allows: A) A base module/component; B) A second base module or a combination of 300 mA of peripherals. The following examples illustrate the above, yet it is to be appreciated that the examples are not to be limiting on the claimed subject matter.

For example, two I/O modules (herein referred to as "A" and "B") can be stacked together to provide a total draw of 400 mA. A user can plug in a High power USB Peripheral device "C" which initially powers up at 100 mA and then requests 150 mA. The host driver can deny the request to "C" since 400 mA+150 mA=550 mA and that would be over the allowed limit of 500 mA. "C" could then remain in an idle state.

In another example, two I/O modules ("A" and "B") can be stacked together to provide a total draw of 400 mA. A user can plug in a High power USB Peripheral device "D" which initially powers up at 200 mA in violation of the USB specification. The host's power switch can then disable the power supplied to the entire downstream port, effectively turning off A, B and C since 400 mA+200 mA=600 mA and that is over the allowed limit of 500 mA.

In still another example, two I/O modules ("A" and "B") can be stacked together to provide a total draw of 400 mA. A user can plug in a Low power USB Peripheral device "E" which initially powers up at 100 mA and does not request additional current. The host driver can perform no additional action (e.g., power management wise) to "E's" connection since 400 mA+100 mA=500 mA and would be within the allowed limit of 500 mA. "E" would then operate as intended.

In yet another example, two I/O modules ("A" and "B") can be vertically stacked together to draw a total of 400 mA. A user can plug in a SELF powered USB Hub device "F" which initially powers up at <100 mA and does not request additional current, but reports itself as a USB Self Powered hub. The host driver can perform no additional action (e.g., power management wise) to "F's" connection since 400 mA+100 mA=500 mA and that would be within the allowed limit of 500 mA. So long as "F" is supplying its own power, "F" can be attached to additional devices and power them. For instance, the self powered USB Hubs can be tested to ensure that they meet the requirements of a truly self powered hub.

Figure 4:
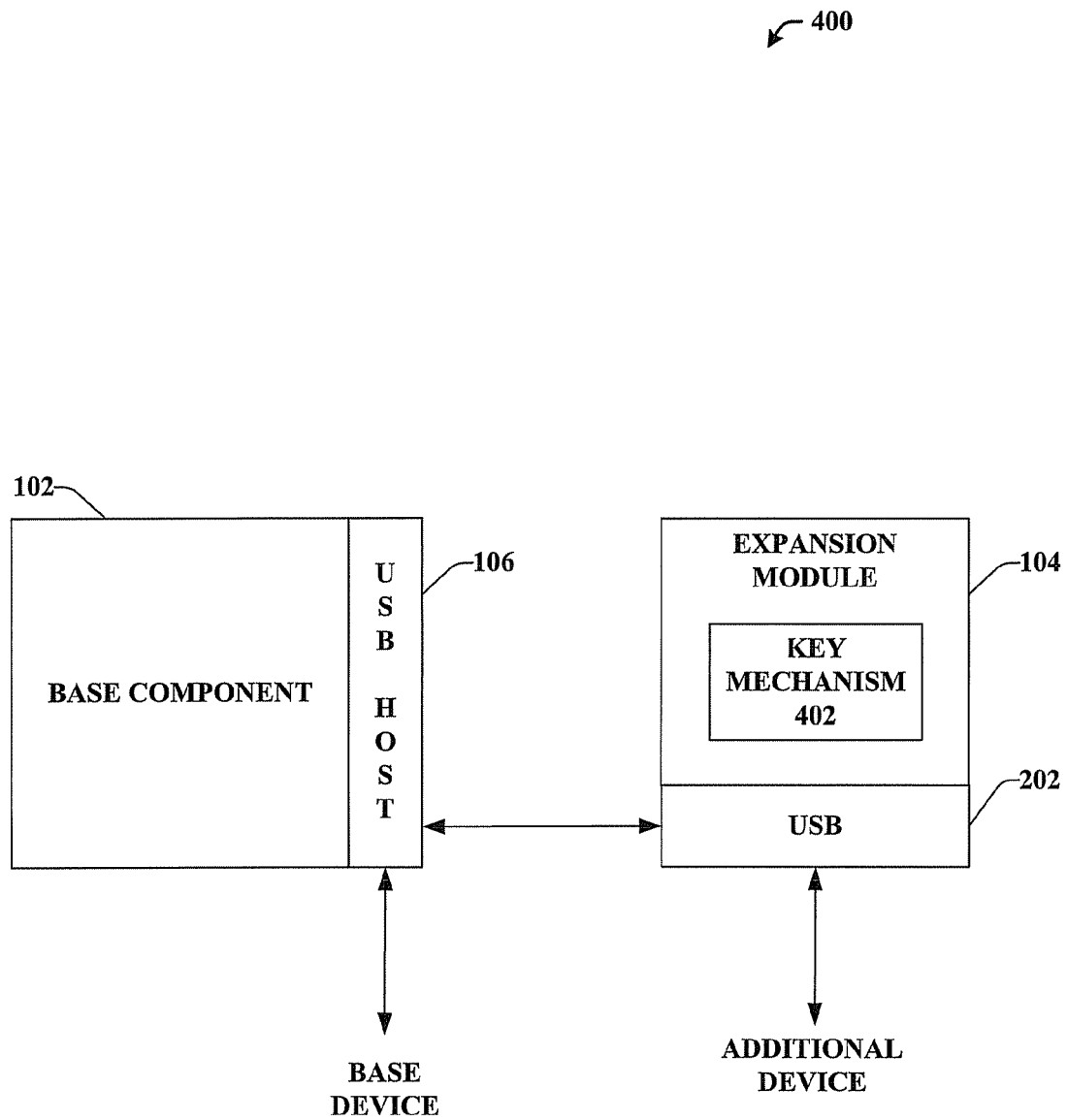
FIG. 4 illustrates a block diagram of an exemplary system that facilitates providing a key locking feature to prevent exceeding power limitations.

FIG. 4 illustrates a system 400 that facilitates providing a key locking feature to prevent exceeding power limitations. The expansion module 104 can further include a key mechanism 402 that can maintain the power draw and/or consumption of a particular module, base component, expansion module, and/or any combination thereof within a particular limit and/or threshold. The key mechanism 402 can be substantially similar to the power management component described in previous figures, yet the key mechanism can be a physical restraint and/or enforcement rather than software-type, application-type, driver-type, protocol-type, etc. restraint. For instance, the module combination can ascertain that the power draw is within a particular range and any additional devices and/or modules would draw a power amount over the particular range, thus the key mechanism can lock out a user from adding an additional module and/or device to the combination. In one example, the module can include snap-feet that allow additional modules to be stacked upon the backside of each other and the key mechanism can restrain any snap-feet to be utilized when the power draw is outside specified limitations.

In another example, the key mechanism 402 can utilize the power keying technique that can physically prevent the vertical stacking of an additional expansion module when the power constraints exceed and/or are at the upper threshold. In one instance, the physical restraint can be a connector that can be turned in a vertical orientation so that another expansion module can not be stacked vertically on the base component 102 and/or an expansion module that is the last stacked module. For example, the base module 102 can have 2 expansion modules connected thereto (a first expansion module and a second expansion module, wherein the first expansion module is connected to the base component 102 and the second expansion module is connected to the first expansion module). If a third expansion module is to be added to the combination of the base component 102, the first expansion module, and the second expansion module, such power consumption of the third, second, first expansion modules, and the base component may not be over the threshold limit for power draw. If such combination is over the threshold limit, the key mechanism 402 can employ a physical restraint to prevent the stacking of the third expansion module to the backside of the second expansion module.

In another example to ensure clarity of the implementation of a physical restraint to prevent the stacking of an expansion module that may exceed power limitations, a single high power module "G" can be stacked on the terminal to draw 400 mA. The pass through USB connector on this module still allows 100 mA for peripherals, but is 'keyed'-turned vertically to prevent further IO modules from physically being stacked.

Figure 5:
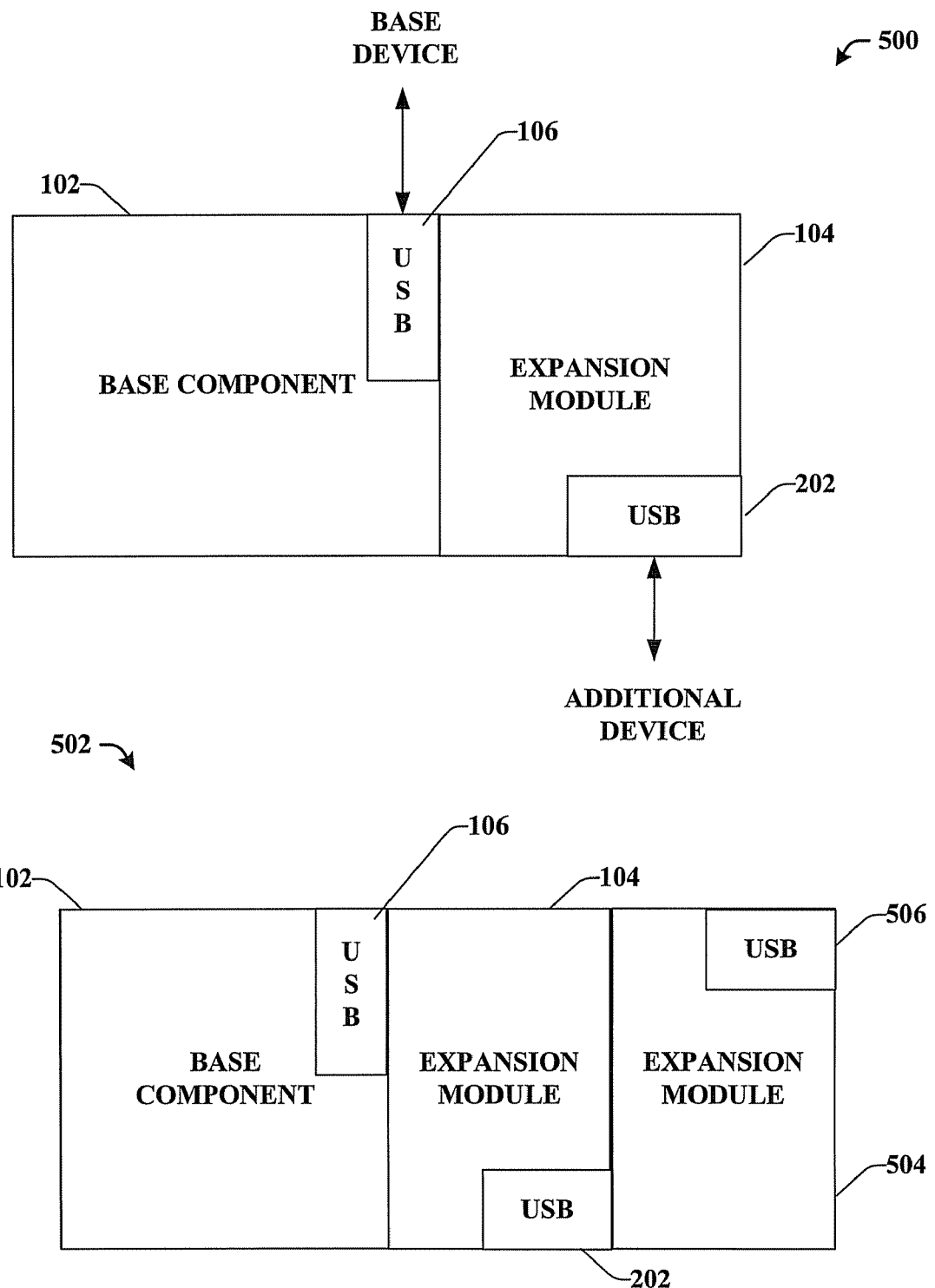
FIG. 5 illustrates a block diagram of an exemplary system that facilitates expanding a base component utilizing an existing universal serial bus (USB).

FIG. 5 illustrates a module combination 500 that facilitates expanding a base component utilizing an existing universal serial bus (USB). The module combination 500 includes the base component 102 with a respective USB 106, wherein a base device can be communicatively coupled to the base component. In order to provide a convenience, and low-cost expansion, the expansion module 104 can be vertically stacked on the backside of the base component 102 such that the USB 106 can be replicated to allow the module to be implemented in conjunction with the base component 102 as well as provide an additional device (e.g., compatible with USB) to be employed via the USB 202. In addition, the expansion module 104 can be remotely mounted utilizing, for instance, a standard USB cable and mounting such expansion module 104 in a remote location (e.g., a DIN rail). It is to be appreciated that various power constraints and/or keying mechanisms (both discussed supra) can be utilized to limit and/or prevent the module combination from exceeding power constraints.

A disparate module combination 502 can be employed, wherein the module combination 500 has an additional expansion module added thereto. An expansion module 504 can be stacked on the backside of the expansion module 104 in a vertical manner. The expansion module 504 can provide a USB 506 that can be a replication of the USB 202 and/or a replication of the USB 106 to allow for an additional device to be implemented. It is to be appreciated that the module combinations 500 and 502 can be stacked to include any suitable number of expansion modules, from 1 to N, where N is a positive integer.

Figure 6:
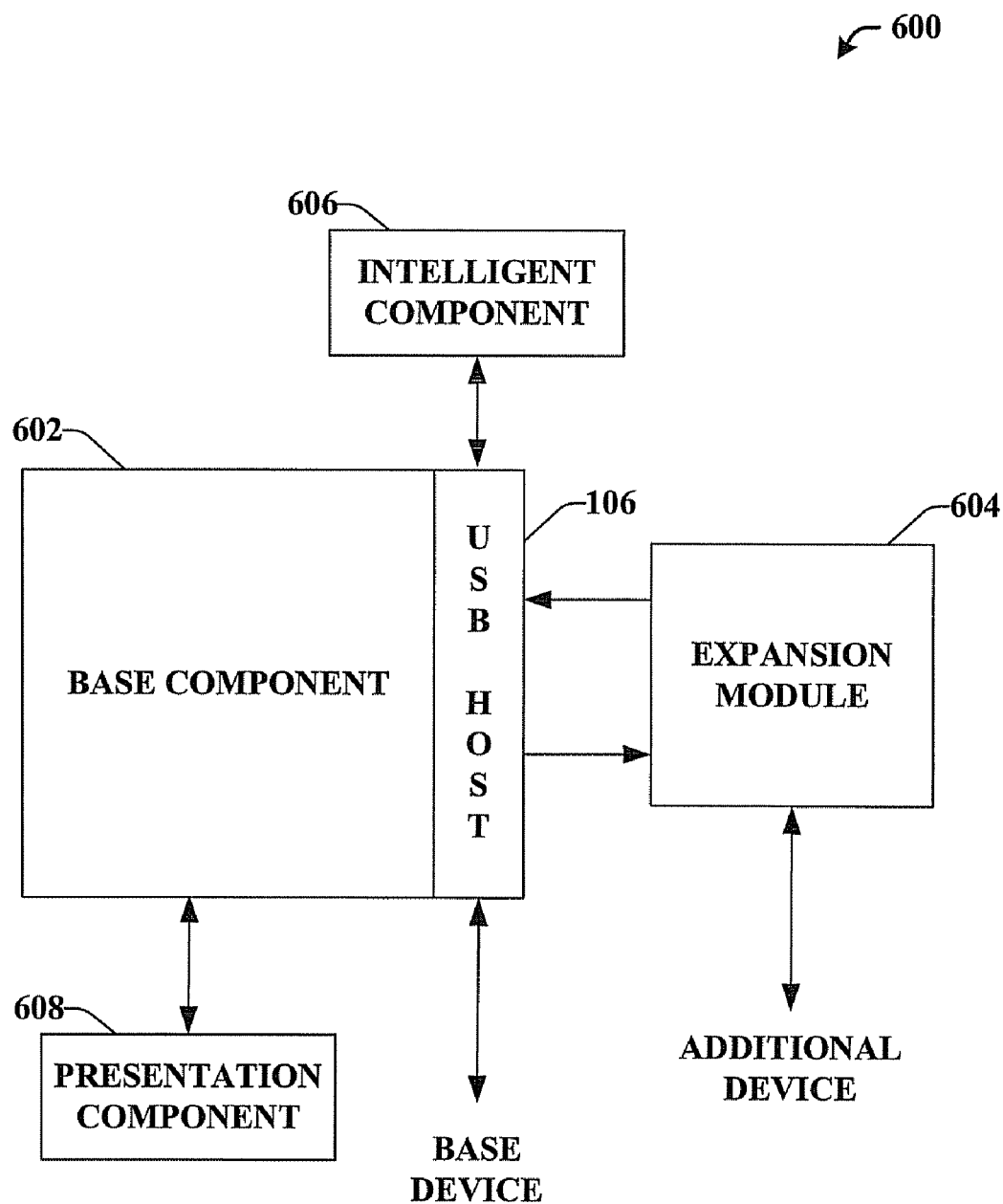
FIG. 6 illustrates a block diagram of an exemplary system that facilitates expanding a base component by leveraging a respective universal serial bus (USB).

FIG. 6 illustrates a system 600 that employs intelligence to facilitate expanding a base component by leveraging a respective universal serial bus (USB). The system 600 can include a base component 602, an expansion module 604, and a USB host 106 that can all be substantially similar to respective components, modules, and hosts described in previous figures. The system 600 further includes an intelligent component 606. The intelligent component 606 can be utilized by the base component 602, the USB host 106, and/or the expansion module 604 to facilitate replicating the USB host 106 to allow for a vertical, modular, and stackable expansion of the base component 602. For example, the intelligent component 606 can infer power constraints, thresholds, module settings, base component configurations, keying mechanisms, power limitations, power thresholds, USB protocols, USB drivers, etc.

Moreover, the intelligent component 606 can facilitate utilizing a consumption of a material and the status of such material to an operator role and/or position. For example, the intelligent component 606 can infer the consumption of raw materials utilized in the production of a particular industrial automation process and/or system. Such inference can be based at least in part upon historic data related to the consumption of materials, status and/or supply of materials, etc. Moreover, such consumption and status of materials can be communicated to an operator and/or the role of an operator.

It is to be understood that the intelligent component 606 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the claimed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

A presentation component 608 can provide various types of user interfaces to facilitate interaction between a user and any component coupled to the base component 602. As depicted, the presentation component 608 is a separate entity that can be utilized with the base component 602. However, it is to be appreciated that the presentation component 608 and/or similar view components can be incorporated into the base component 602 and/or a stand-alone unit. The presentation component 608 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to the base component 602.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

Referring to FIGS. 7-12, schematic illustrations in accordance with various aspects of the claimed subject matter are illustrated. It is to be appreciated and understood that the schematic illustrations are exemplary configurations and that various subtleties can be employed and/or implemented; yet such minor manipulations are to be considered within the coverage of the subject innovation.

Figure 7:
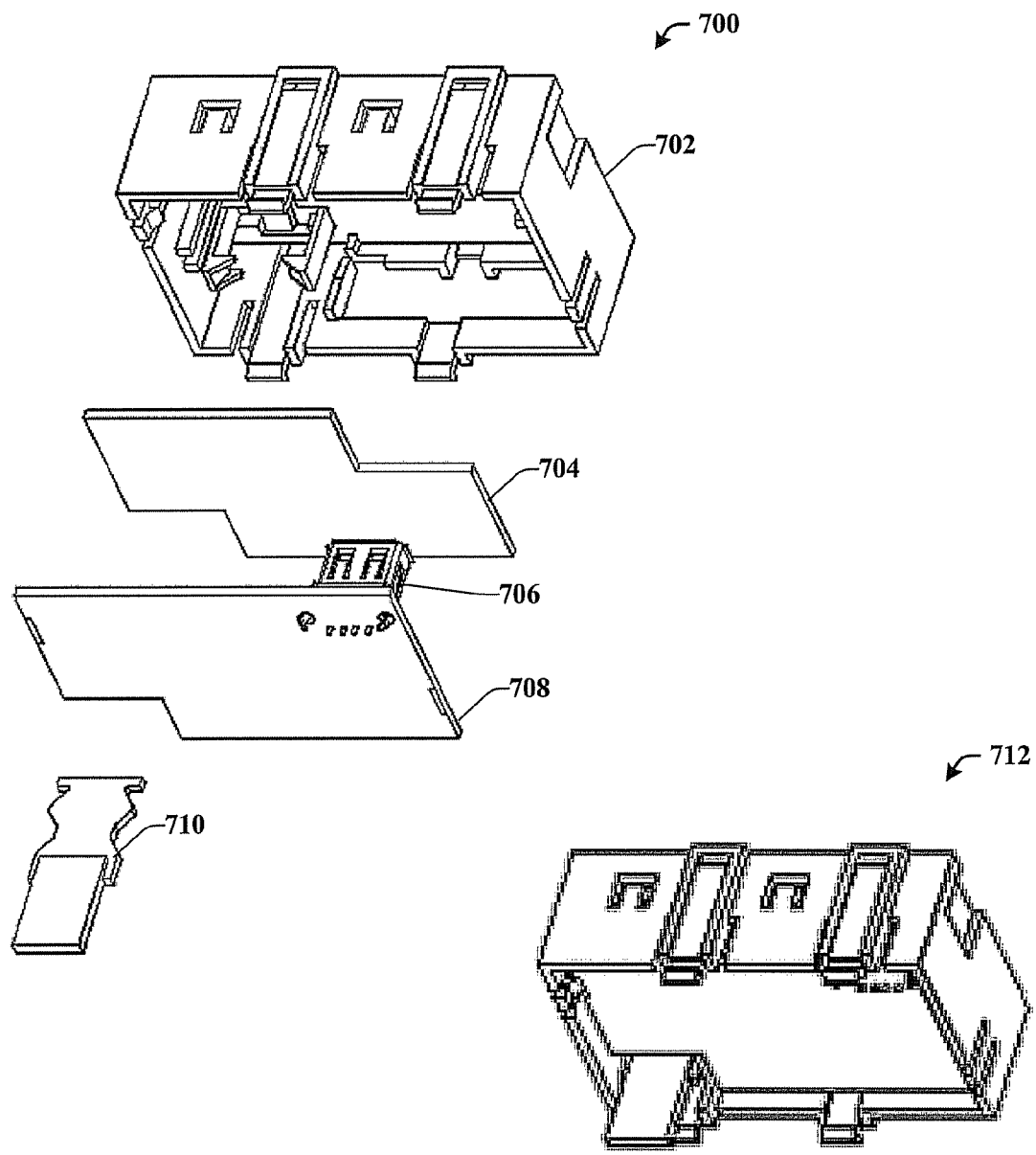
FIG. 7 illustrates a block diagram of an exemplary assembly of an expansion module that replicates a base component universal serial bus (USB).

FIG. 7 illustrates an assembly 700 of an expansion module that replicates a base component universal serial bus (USB). The assembly 700 can be utilized as a module that can be vertically stacked on a backside of a base component (not shown). The assembly 700 illustrates a casing 702 that includes a first board 704 and a second board 706, wherein the casing 702 can be, but is not limited to, plastic, metal, and/or any combination thereof. The second board 708 can include a replicated USB 706 that allows an additional device to connect thereto in addition to the device(s) utilizing the base component USB port. Moreover, the assembly 700 can include a tolerance piece 710 that can provide rigidity and to hold the assembly 700 in place. Although depicted with the first board 704 and a second board 708, it is to be appreciated that any suitable number of boards can be employed with the assembly 700. A fully assembled module 712 is also illustrated in FIG. 7.

Figure 8:
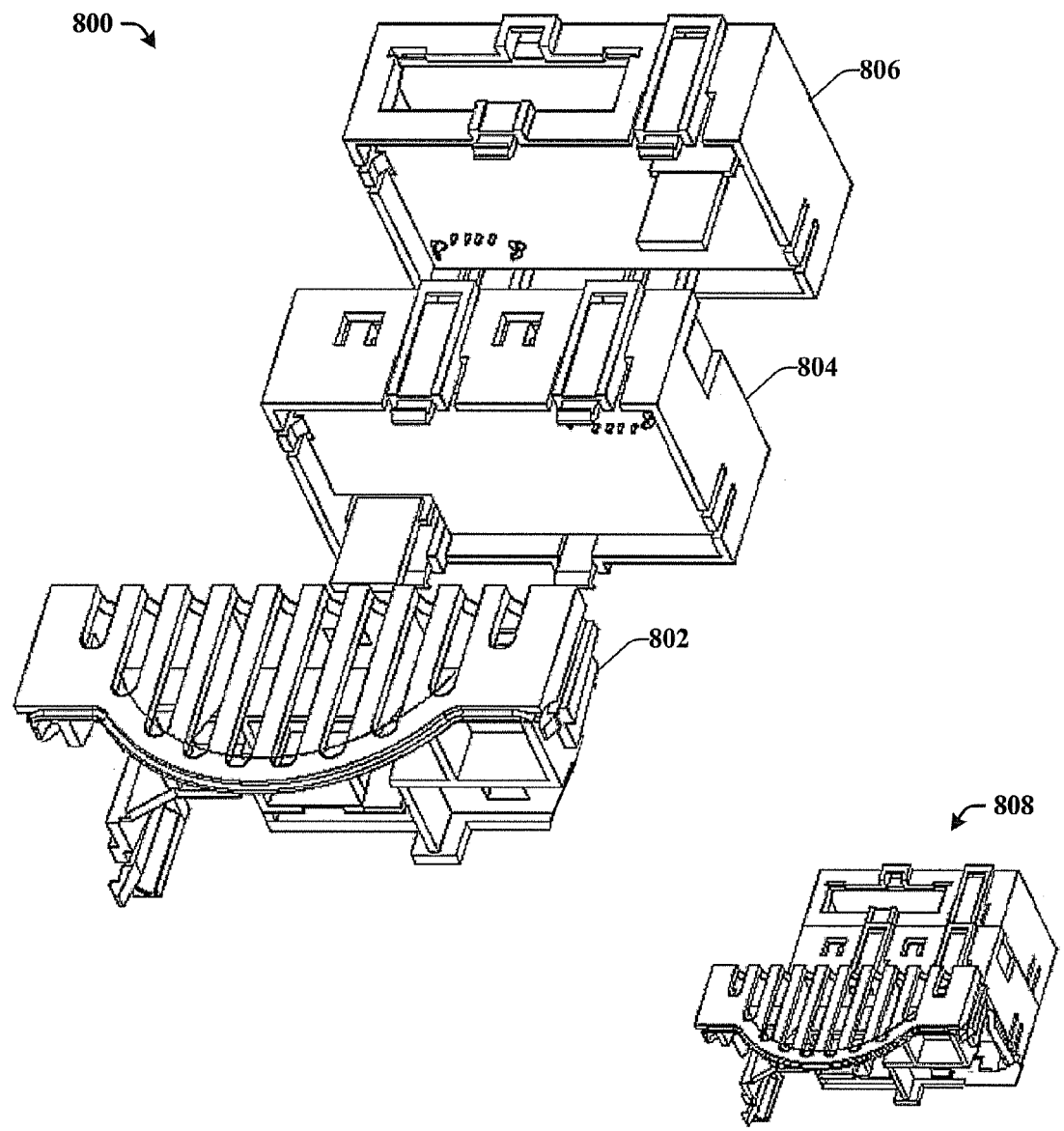
FIG. 8 illustrates a block diagram of an exemplary assembly of multiple expansion modules stacked on the backside portion of a base component.

FIG. 8 illustrates an assembly 800 of multiple expansion modules stacked on the backside portion of a base component. The assembly 800 includes a base component 802, wherein the base component 802 can be, but is not limited to, a base product (e.g., any suitable product employing at least one USB port), a base human machine interface (HMI) terminal, a panel, a panel view, etc. A first expansion module 804 can be stacked vertically on the backside of the base component 802 to replicate a USB host/port associated with the base component 802 as described in previous figures. Moreover, a second expansion module 806 can be stacked vertically on the backside of the first expansion module 804 to provide an additional replicated USB port. The combination of the base component 802, the first expansion module 804, and the second expansion module 806 is depicted as a complete package 808, wherein snap-feet and/or any other suitable fastening mechanism can be utilized to provide appropriate fitting and/or physical connection.

Figure 9:
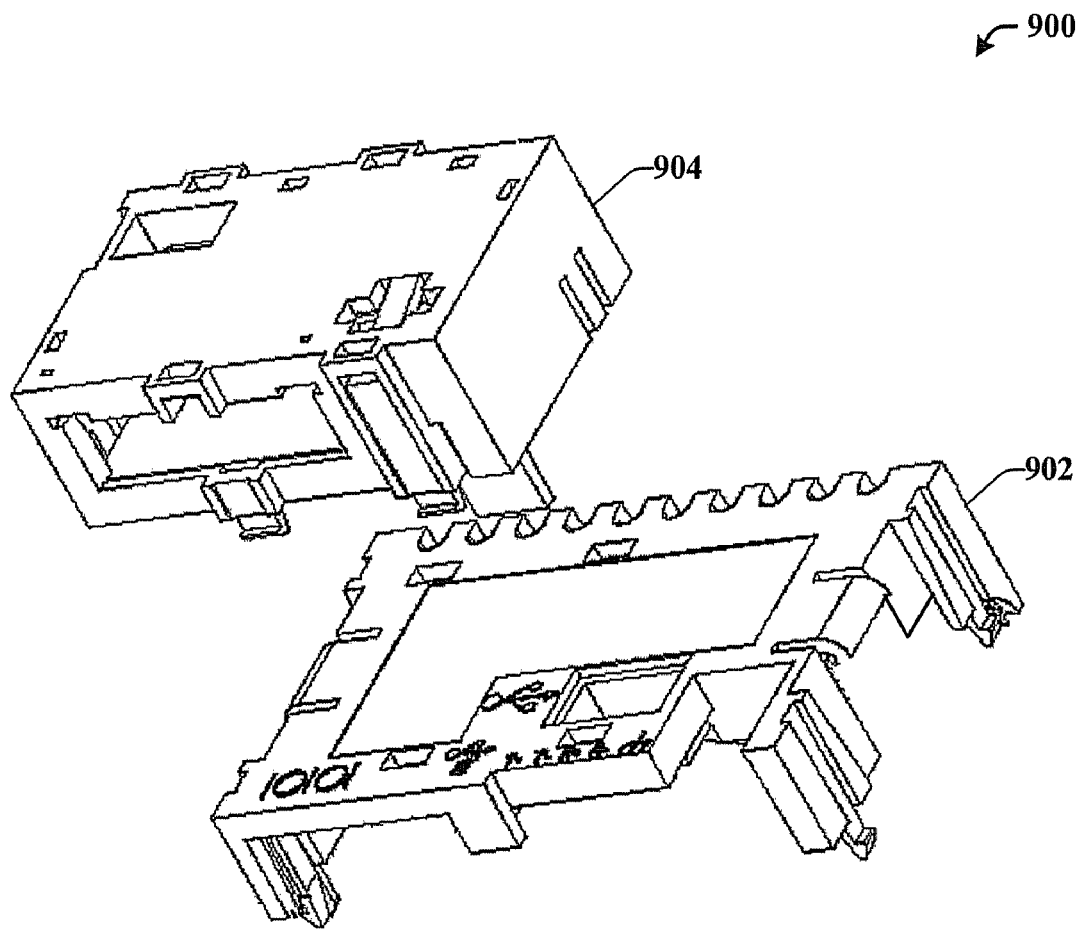
FIG. 9 illustrates a block diagram of an exemplary assembly of an expansion module and a backside portion of a base component.

FIG. 9 illustrates a schematic 900 of an exemplary assembly of an expansion module and a backside portion of a base component. The schematic 900 illustrates a disparate view of a base component 902 with an expansion module 904. As depicted, it is to be appreciated that the expansion module 904 can physically fit into the backside of the base component 902 to provide a replicated USB port at a low-cost and optimized usage of space. In particular, the expansion module 904 can utilize snap-feet that can clip into the base component 902 and respective slots. Although at least one snap-foot can be utilized, it is to be understood any suitable mechanism and/or technique can be employed to stack the expansion module 904 to the backside of the base component 902.

Figure 10:
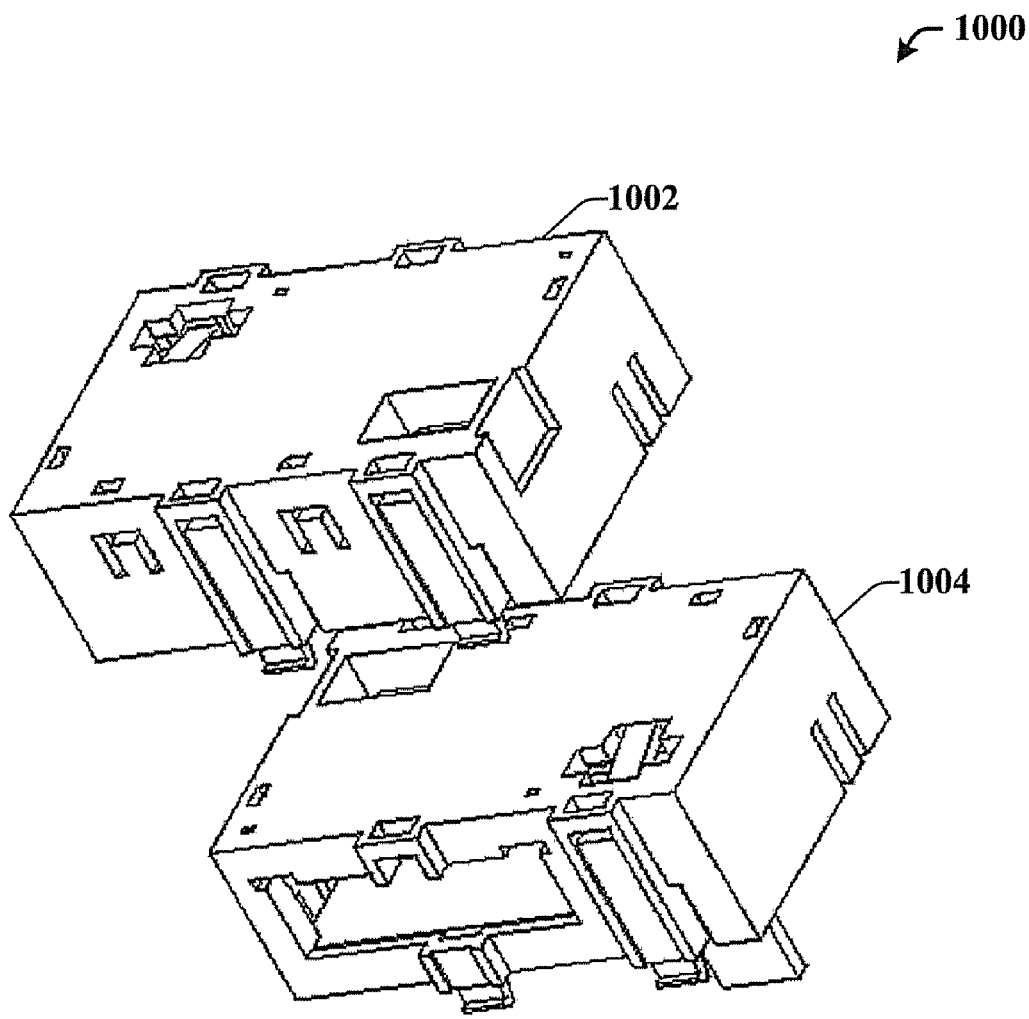
FIG. 10 illustrates a block diagram of an exemplary assembly of a first expansion module and a second expansion module in accordance with the claimed subject matter.

FIG. 10 illustrates a schematic 1000 of a first expansion module and a second expansion module in accordance with the claimed subject matter. The schematic 1000 includes a first module 1002 and a second module 1004, wherein each module can be vertically stacked on a backside of a base component (not shown). The first module 1002 and the second module 1004 can physically connect to each other utilizing at least one snap-foot. As depicted yet not limited, the first module 1002 and the second module 1004 include male and female fittings for the snap-feet. In particular, the second module 1004 includes four (4) female fittings that can allow four (4) snap-feet (e.g., a male fitting) to fit therewith. Furthermore, such female and male fittings can be utilized to allow additional module connectivity and/or a physical connection to the backside of a base component (not shown). As discussed previously, the first module 1002 and the second module 1004 can expand upon each other and/or a base component (not shown), wherein such expansion allows a replication of a USB port.

Figure 11:
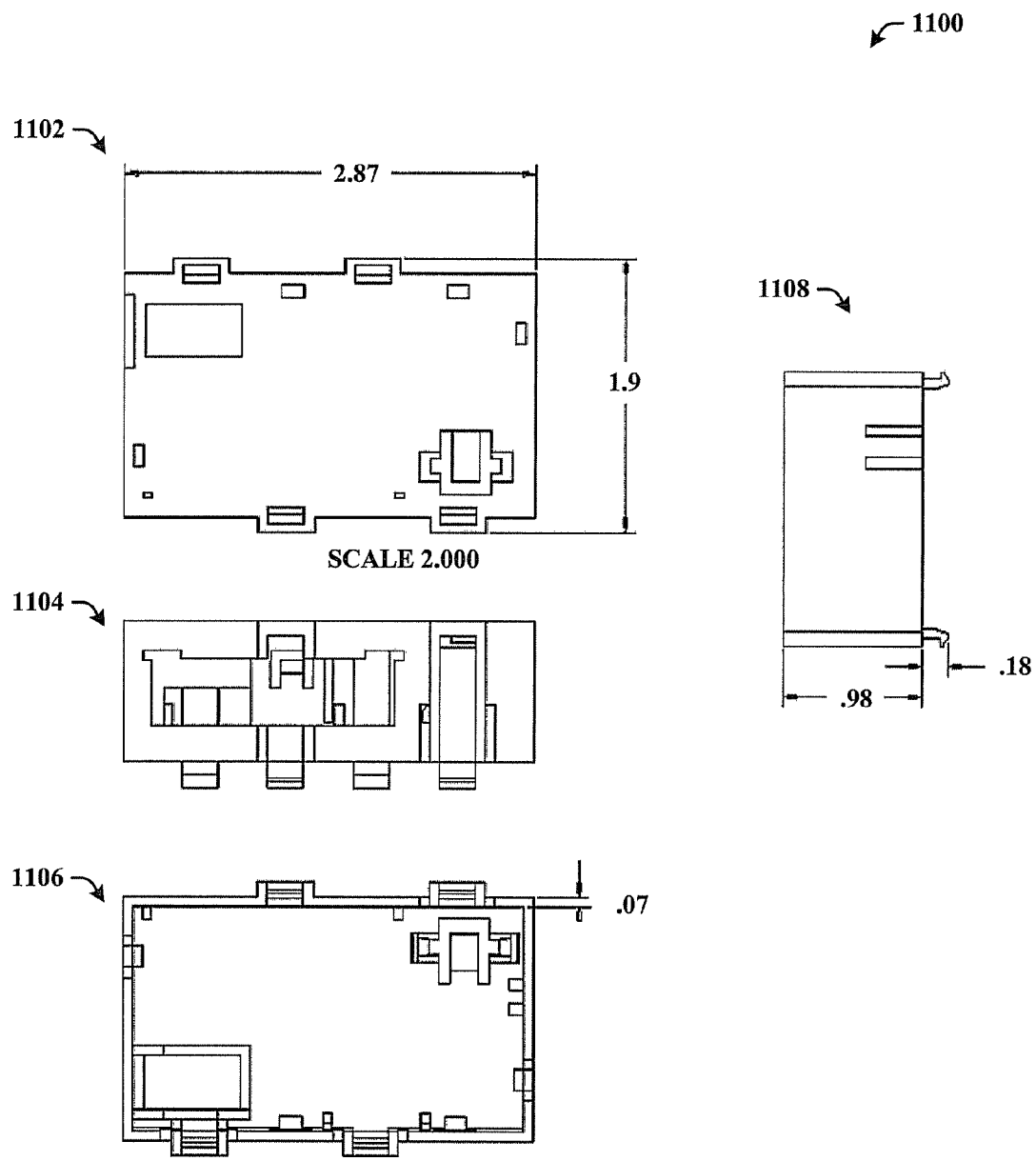
FIG. 11 illustrates a block diagram of an exemplary casing of an expansion module in accordance with the subject innovation.

FIG. 11 illustrates a schematic 1100 of an expansion module in accordance with the subject innovation. The schematic 1100 depicts a casing for a module and/or an expansion module as described in accordance with the subject innovation. Although dimensions are depicted, it is to be appreciated that such dimensions and/or scaling are illustrated for exemplary purposes only and are not to be limiting on the claimed subject matter. A top view 1102 illustrates the casing of the expansion module (also referred to as module herein). A side view 1104 depicts the casing of the expansion module including the snap-feet utilized to physically stack onto a disparate module (not shown) and/or base component (not shown). A bottom view 1106 of the casing related to the expansion module is further shown as well as a side view 1108. It is to be appreciated and understood that the schematic 1100 illustrates the casing of the expansion module and any software, hardware, circuitry, circuit boards, and the like are not illustrated for the sake of brevity.

Figure 12:
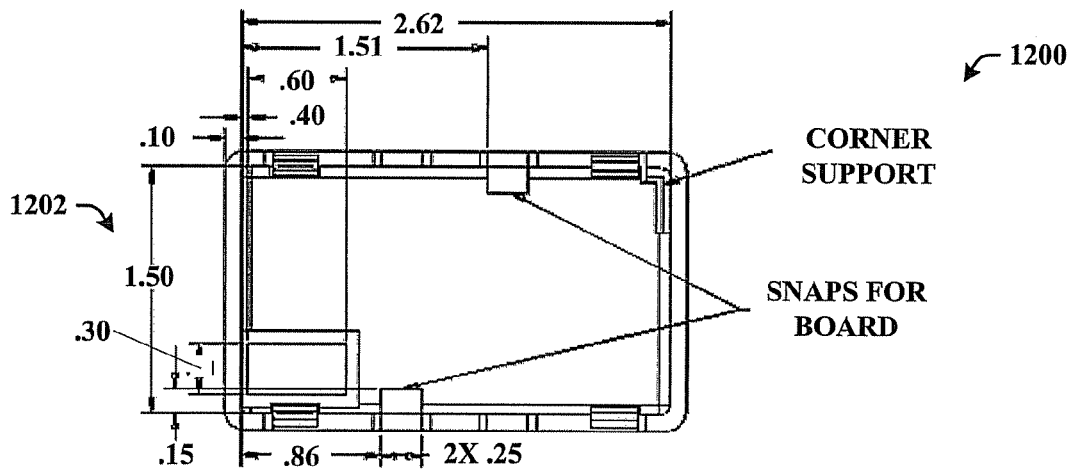
FIG. 12 illustrates a block diagram of an exemplary casing of an expansion module in accordance with the subject innovation.
Figure 12:
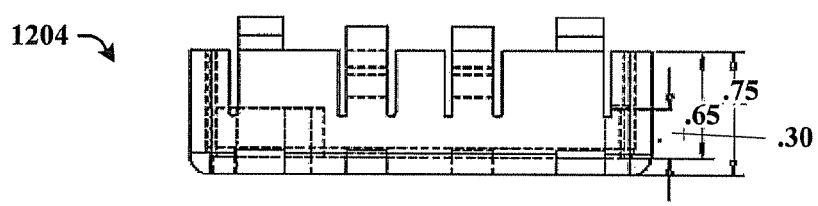
Figure 12:
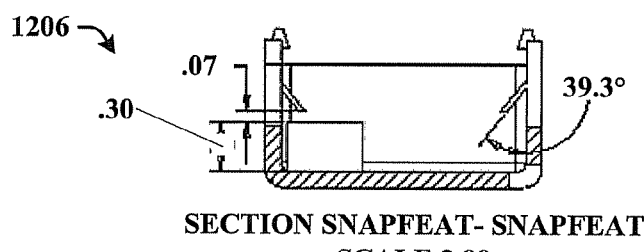
Figure 12:
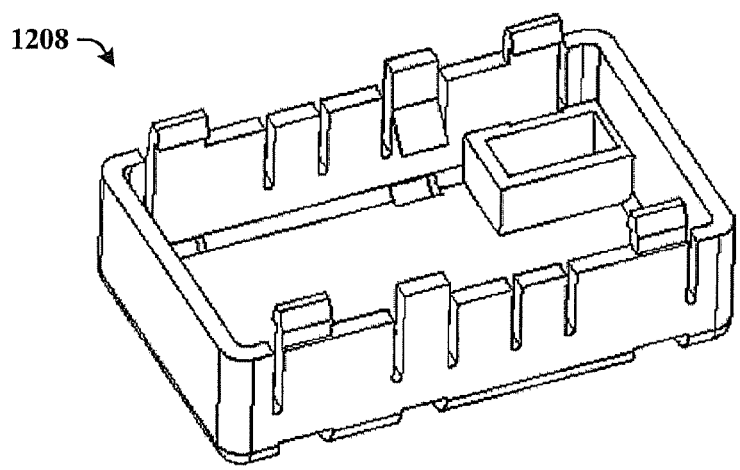

FIG. 12 illustrates a schematic 1200 of an expansion module in accordance with the subject innovation. The schematic 1200 depicts a casing for a module and/or an expansion module as described in accordance with the subject innovation. Although dimensions are depicted, it is to be appreciated that such dimensions and/or scaling are illustrated for exemplary purposes only and are not to be limiting on the claimed subject matter. The expansion module is illustrated in the various perspectives, a top view 1202, a side length-wise view 1204, and a side width-wise view 1206. Moreover, a dimension-free expansion module 1208 is illustrated for clarity. It is to be appreciated and understood that the schematic 1200 illustrates the casing of the expansion module and any software, hardware, circuitry, circuit boards, and the like are not illustrated for the sake of brevity.

Figure 13:
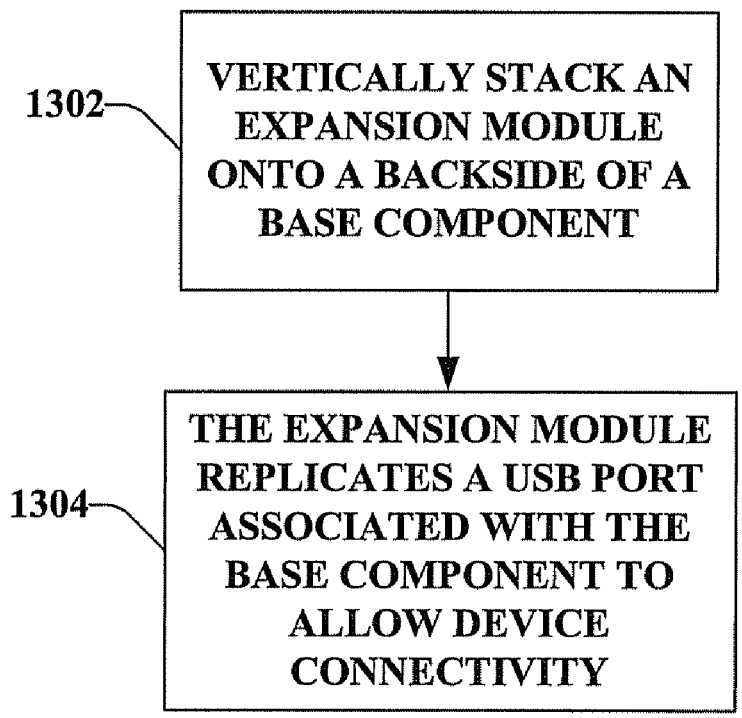
FIG. 13 illustrates an exemplary methodology for expanding a base component by leveraging a respective universal serial bus (USB).
Figure 14:
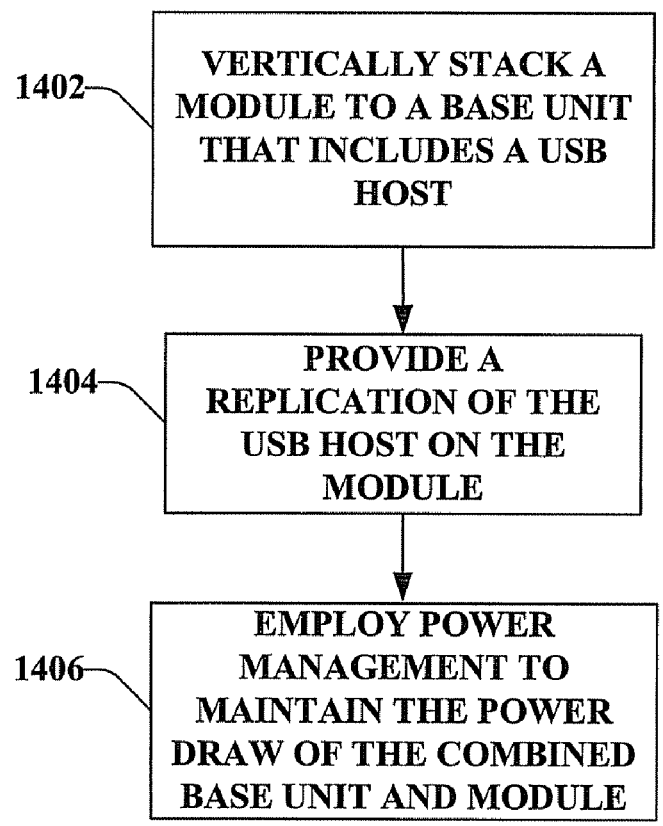
FIG. 14 illustrates an exemplary methodology that facilitates managing power consumption associated with a base component and an expansion module that leverages universal serial bus (USB) technology related to the base component.
Figure 15:
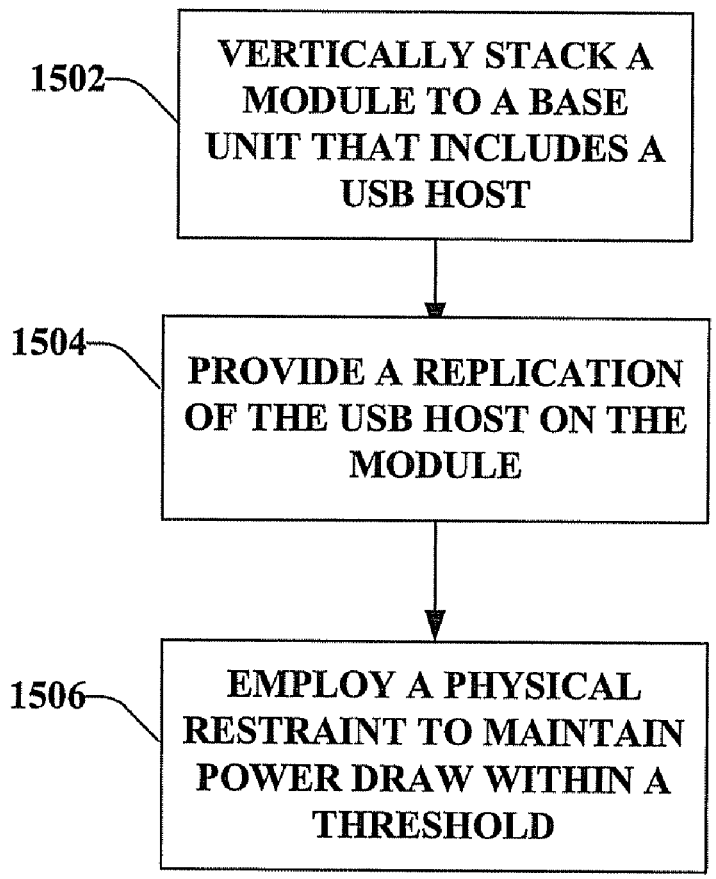
FIG. 15 illustrates an exemplary methodology that facilitates providing a key locking feature to prevent exceeding power limitations.

Referring to FIGS. 13-15, methodologies in accordance with various aspects of the claimed subject matter are illustrated. While, for purposes of simplicity of explanation, the methodologies are shown and described as a series of acts, it is to be understood and appreciated that the claimed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Turning specifically to FIG. 13, a methodology 1300 is illustrated for expanding a base component by leveraging a respective universal serial bus (USB). At reference numeral 1302, an expansion module can be vertically stacked on a backside of a base component. In addition, the expansion module can be remotely mounted utilizing, for instance, a standard USB cable and mounting such expansion module in a remote location (e.g., a DIN rail). It is to be appreciated that a base component can be, but is not limited to, a base product (e.g., any suitable product employing at least one USB port), a base human machine interface (HMI) terminal, a panel, a panel view, etc. In addition, the expansion module (also referred to as a module herein) can be, but is not limited to, an input/output module, a communication module, etc.

At reference numeral 1304, the expansion module can replicate a USB port associated with the base component to allow device connectivity. The USB port can provide connectivity to any suitable USB device, such as, but not limited to, a keyboard, a mouse, an input device, a hard drive, a pen drive, a speaker, a device cable, a battery backup, a media player, a tablet, and any suitable device/component that can employ a USB connection. Moreover, it is to be appreciated that the USB host can be at least one of a standard USB type A, a USBOTG port (e.g., USB On The Go) that includes a host function, USB 1.1, USB 2.0, low speed USB, full speed USB, high speed USB, etc. In other words, the expansion module can leverage the standard USB technology associated with the base component to allow stacking input/output and/or communication modules (e.g., additional devices) by plugging into the base component via the USB host. Thus, the additional device/module and/or USB device can be plugged into the replicated port. It is to be appreciated that such methodology 1300 provides a stackable port replicating solution to allow modular expansion, wherein there can be any suitable number of expansion modules daisy-chained implementing any suitable number of additional devices with respective replicated USB ports.

FIG. 14 illustrates a methodology 1400 that facilitates managing power consumption associated with a base component and an expansion module that leverages universal serial bus (USB) technology related to the base component. At reference numeral 1402, a module can be vertically stacked to a base unit, wherein the base unit can include a USB host. In addition, the expansion module can be remotely mounted utilizing, for instance, a standard USB cable and mounting such expansion module in a remote location (e.g., a DIN rail). For example, the base unit can be a base component, a base product (e.g., any suitable product employing at least one USB port), a base human machine interface (HMI) terminal, a panel, a panel view, etc. The USB host can employ communicative connectivity to any suitable USB device, such as, but not limited to, a keyboard, a mouse, an input device, a hard drive, a pen drive, a speaker, a device cable, a battery backup, a media player, a tablet, and any suitable device/component that can employ a USB connection.

At reference numeral 1404, a replication of the USB host can be provided on the module. The module (also referred to as an expansion module) can be an input/output module and/or a communication module that expands the base component by replicating the associated USB host to allow additional USB devices to be implemented. By replicating the USB host on the base component, the modular expansion solution adds no cost to the base component while providing another module and/or standard USB device to in turn be plugged into the replicated port. For instance, a module can expand a base component that can be a base HMI terminal having a USB port/host. The module can be stacked on the backside of the base HMI terminal to allow an additional USB device to plug as well as allowing the USB port/host to be utilized (e.g., for a device and/or the expansion module, and/or any combination thereof).

At reference numeral 1406, a power management can be employed to maintain the power draw of the combined base unit and at least one module. The power management can employ various protocols to regulate power consumption for the totality of modules/components. In other words, there can be a power limitation associated with the various USB devices, base components, USB ports, USB compatible devices, and the like, wherein regulation and limitation of such power consumption may be necessary to ensure efficient and proper implementation. The power management can include, for instance, a USB protocol, a USB driver, and/or any other suitable mechanism that ascertains the power draw and maintains such draw within specified restraints between the base component and at least one module stacked onto the base component.

FIG. 15 illustrates a methodology 1500 that facilitates providing a key locking feature to prevent exceeding power limitations. At reference numeral 1502, a module can be vertically stacked to a backside of a base unit that includes a USB host. In addition, the expansion module can be remotely mounted utilizing, for instance, a standard USB cable and mounting such expansion module in a remote location (e.g., a DIN rail). At reference numeral 1504, a replication of the USB host can be implemented on the module. In other words, the expansion module can leverage the standard USB technology associated with the base component to allow stacking input/output and/or communication modules (e.g., additional devices) by plugging into the base component via the USB host. Thus, the additional device/module and/or USB device can be plugged into the replicated port.

At reference numeral 1506, a keying mechanism can be employed to maintain power draw within a particular threshold. In particular, the keying mechanism can be a physical restraint restricting additional modules to be stacked onto a combination of the base component and at least one module. For instance, the module combination can ascertain that the power draw is within a particular range and any additional devices and/or modules would draw a power amount over the particular range, thus the key mechanism can lock out a user from adding an additional module and/or device to the combination. In one example, the module can include snap-feet that allow additional modules to be stacked upon the backside of each other and the key mechanism can restrain any snap-feet to be utilized when the power draw is outside specified limitations.

Figure 16:
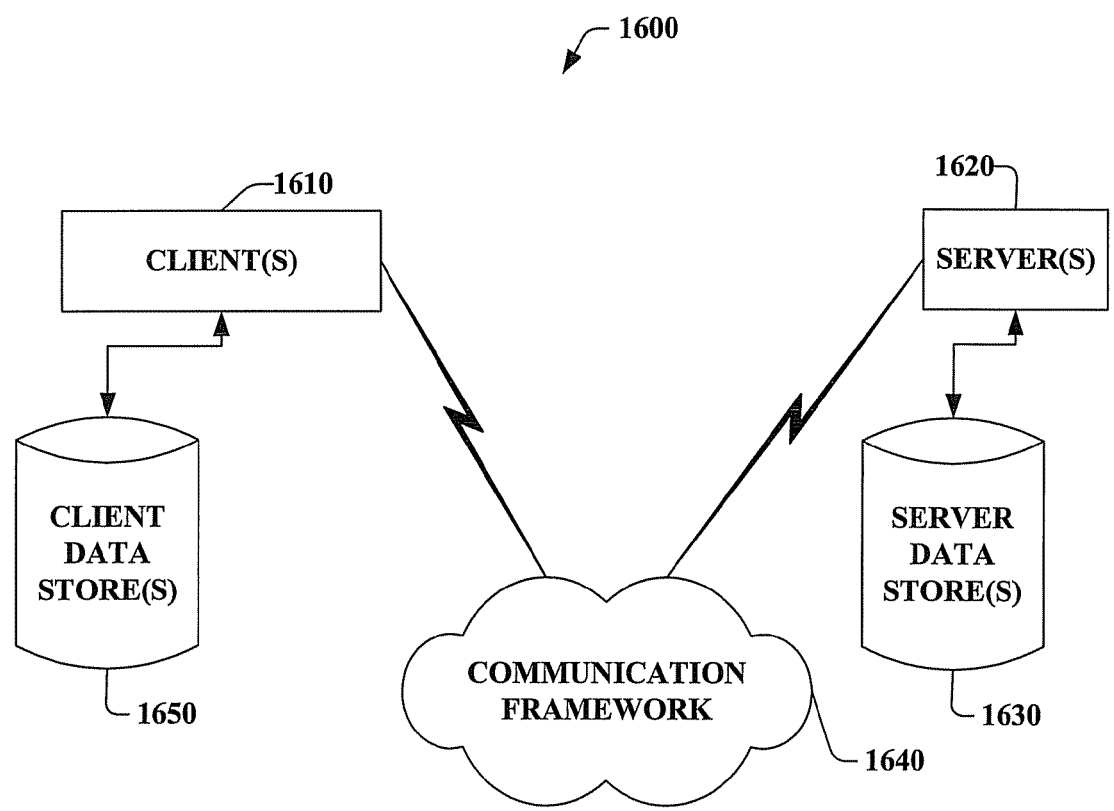
FIG. 16 illustrates an exemplary networking environment, wherein the novel aspects of the claimed subject matter can be employed.
Figure 17:
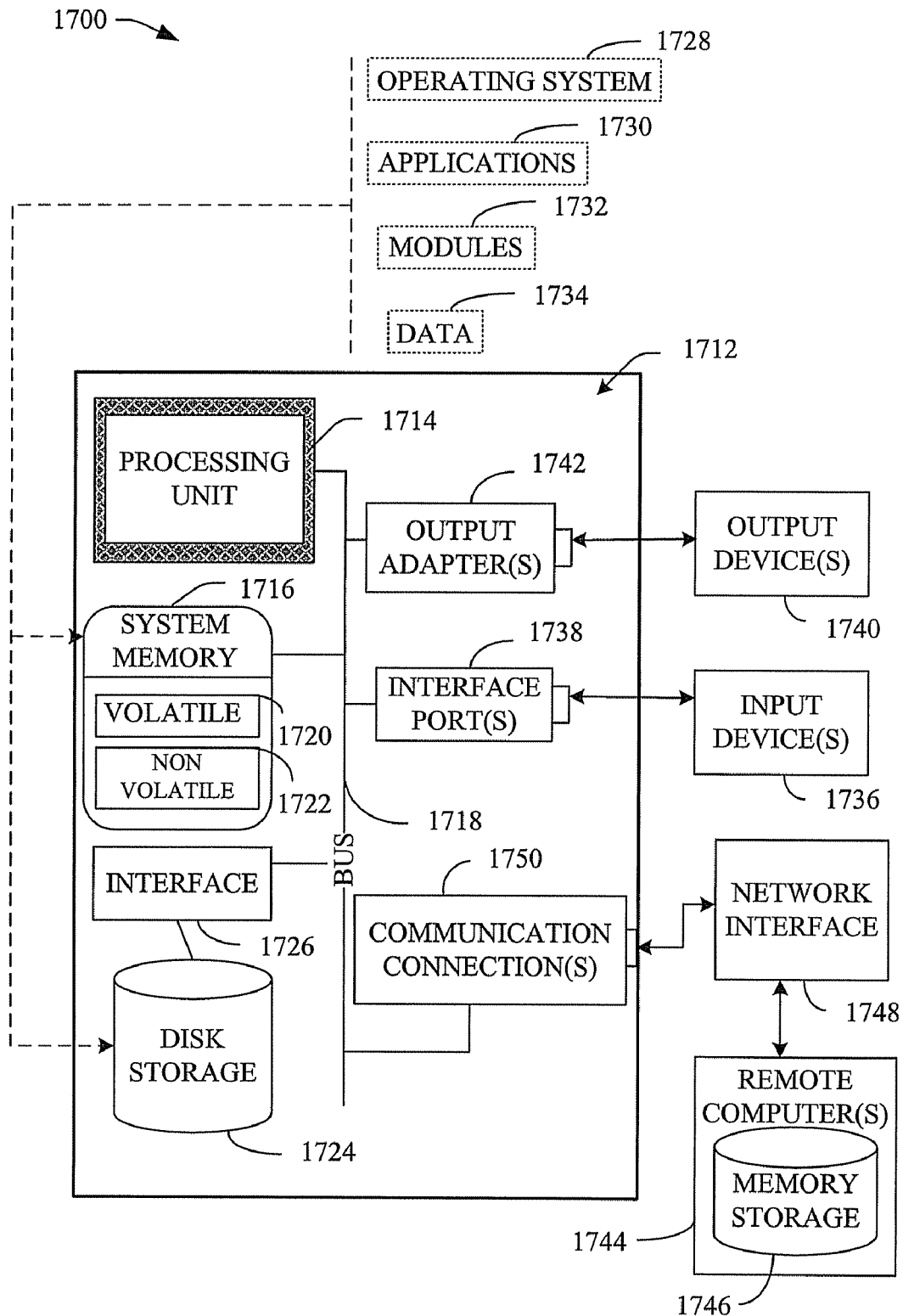
FIG. 17 illustrates an exemplary operating environment that can be employed in accordance with the claimed subject matter.

In order to provide additional context for implementing various aspects of the claimed subject matter, FIGS. 16-17 and the following discussion is intended to provide a brief, general description of a suitable computing environment in which the various aspects of the subject innovation may be implemented. While the claimed subject matter has been described above in the general context of computer-executable instructions of a computer program that runs on a local computer and/or remote computer, those skilled in the art will recognize that the subject innovation also may be implemented in combination with other program modules. Generally, program modules include routines, programs, components, data structures, etc., that perform particular tasks and/or implement particular abstract data types.

Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based and/or programmable consumer electronics, and the like, each of which may operatively communicate with one or more associated devices. The illustrated aspects of the claimed subject matter may also be practiced in distributed computing environments where certain tasks are performed by remote processing devices that are linked through a communications network. However, some, if not all, aspects of the subject innovation may be practiced on stand-alone computers. In a distributed computing environment, program modules may be located in local and/or remote memory storage devices.

FIG. 16 is a schematic block diagram of a sample-computing environment 1600 with which the claimed subject matter can interact. The system 1600 includes one or more client(s) 1610. The client(s) 1610 can be hardware and/or software (e.g., threads, processes, computing devices). The system 1600 also includes one or more server(s) 1620. The server(s) 1620 can be hardware and/or software (e.g., threads, processes, computing devices). The servers 1620 can house threads to perform transformations by employing the subject innovation, for example.

One possible communication between a client 1610 and a server 1620 can be in the form of a data packet adapted to be transmitted between two or more computer processes. The system 1600 includes a communication framework 1640 that can be employed to facilitate communications between the client(s) 1610 and the server(s) 1620. The client(s) 1610 are operably connected to one or more client data store(s) 1650 that can be employed to store information local to the client(s) 1610. Similarly, the server(s) 1620 are operably connected to one or more server data store(s) 1630 that can be employed to store information local to the servers 1620.

With reference to FIG. 17, an exemplary environment 1700 for implementing various aspects of the claimed subject matter includes a computer 1712. The computer 1712 includes a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714.

The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1716 includes volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), or flash memory. Volatile memory 1720 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1712 also includes removable/non-removable, volatile/non-volatile computer storage media. FIG. 17 illustrates, for example a disk storage 1724. Disk storage 1724 includes, but is not limited to, devices like a magnetic disk drive, floppy disk drive, tape drive, Jaz drive, Zip drive, LS-100 drive, flash memory card, or memory stick. In addition, disk storage 1724 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1724 to the system bus 1718, a removable or non-removable interface is typically used such as interface 1726.

It is to be appreciated that FIG. 17 describes software that acts as an intermediary between users and the basic computer resources described in the suitable operating environment 1700. Such software includes an operating system 1728. Operating system 1728, which can be stored on disk storage 1724, acts to control and allocate resources of the computer system 1712. System applications 1730 take advantage of the management of resources by operating system 1728 through program modules 1732 and program data 1734 stored either in system memory 1716 or on disk storage 1724. It is to be appreciated that the claimed subject matter can be implemented with various operating systems or combinations of operating systems.

A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port may be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a means of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a personal computer, a server, a router, a network PC, a workstation, a microprocessor based appliance, a peer device or other common network node and the like, and typically includes many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1750 refers to the hardware/software employed to connect the network interface 1748 to the bus 1718. While communication connection 1750 is shown for illustrative clarity inside computer 1712, it can also be external to computer 1712. The hardware/software necessary for connection to the network interface 1748 includes, for exemplary purposes only, internal and external technologies such as, modems including regular telephone grade modems, cable modems and DSL modems, ISDN adapters, and Ethernet cards.

What has been described above includes examples of the subject innovation. It is, of course, not possible to describe every conceivable combination of components or methodologies for purposes of describing the claimed subject matter, but one of ordinary skill in the art may recognize that many further combinations and permutations of the subject innovation are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable medium having computer-executable instructions for performing the acts and/or events of the various methods of the claimed subject matter.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A system that facilitates expanding upon an existing universal serial bus (USB), comprising:
    a base component that includes a USB host to provide connectivity to at least one device;
    an expansion module that physically connects in a vertical position to a backside of the base component without an intervening USB cable, the expansion module provides a replication of the USB host and allows an additional device to connect to the replicated USB host, wherein the expansion module is stackable with one or more additional expansion modules via at least one snap-foot without intervening USB cables; and
    a key mechanism that is adjustable to physically prevents stacking an additional expansion module to a last expansion module in the stack when power draw from the stack is within a threshold range, wherein the keying mechanism is a connector that is turned to an orientation that prevents stacking the additional expansion module.

2. The system of claim 1, the base component is a base product, a base product employing at least one USB port, a base human machine interface (HMI) terminal, a panel, or a panel view.

3. The system of claim 1, wherein the one or more additional expansion modules each provide additional replication of the USB host and allow an additional device to connect to the additional replicated USB host.

4. The system of claim 3, the device is at least one of a keyboard, a mouse, an input device, a hard drive, a pen drive, a speaker, a device cable, a battery backup, a media player, a tablet, or a device employing a USB connection.

5. The system of claim 1, the USB host is at least one of a standard USB type A, a USBOTG port, a USB 1.1, a USB 2.0, a low speed USB, a full speed USB, or a high speed USB.

6. The system of claim 1, the expansion module leverages standard USB technology associated with the base component.

7. The system of claim 1, the expansion module is at least one of an input, an output, or a communication module.

8. The system of claim 1, the expansion module is stackable from a single root hub.

9. The system of claim 1, the base component includes at least one of a male fitting or a female fitting.

10. The system of claim 9, the expansion module includes at least one of a male fitting or a female fitting that couples with the at least one of the male fitting or the female fitting of the base component.

11. The system of claim 1, the expansion module physically attaches to the backside of the base component by employing at least one snap-foot.

12. The system of claim 1, further comprising a power management component that regulates power consumption of the base component and the expansion module.

13. The system of claim 12, the power management component utilizes at least one of a USB protocol or a USB driver to ascertain power draw from the stack and maintain such power draw within a specified threshold.

14. The system of claim 13, the specified threshold is at least one of user specified, application usage based or environment based.

15. The system of claim 12, the power management component maintains such draw within a specified threshold by denying a request for additional power from an additional expansion module in the stack where the additional power causes the power draw from the stack to exceed the specified threshold.

16. A system that facilitates connecting devices, comprising:
    a base unit with a USB port to provide connectivity to at least one device;
    an expansion module that attaches to a backside of the base unit via at least one snap-foot without an intervening cable, wherein the expansion module replicates the USB port for expansion to an additional device, wherein the expansion module has one or more connectors for one or more additional expansion modules to attach to the expansion module in a vertical stack without intervening cables between the expansion module and the one or more additional expansion modules, each additional expansion module provides an additional replication of the USB port, wherein the USB port, replicated USB port and additional replicated USB host are daisy-chained; and
    a key mechanism that adjustable to physically prevents stacking an additional expansion module to a last expansion module in the stack when power draw from the stack is within a threshold range, wherein the keying mechanism is a connector that is turned to an orientation that prevents stacking the additional expansion module.

17. The system of claim 16, the base component is a base product, a base product employing at least one USB port, a base human machine interface (HMI) terminal, a panel, or a panel view.

18. The system of claim 16, each replicated USB port provides connectivity to at least one device.

19. The system of claim 18, the device is at least one of a keyboard, a mouse, an input device, a hard drive, a pen drive, a speaker, a device cable, a battery backup, a media player, a tablet, or a device employing a USB connection.

20. The system of claim 16, the USB port is at least one of a standard USB type A, a USBOTG port, a USB 1.1, a USB 2.0, a low speed USB, a full speed USB, and a high speed USB.

21. The system of claim 16, the expansion module leverages standard USB technology associated with the base component.

22. The system of claim 16, the expansion module is at least one of an input, an output, or a communication module.

23. The system of claim 16, further comprising a power management component that maintains total power draw from the stack within a specified threshold by denying a request for additional power from an additional expansion module in the stack where the additional power causes the total power draw to exceed the specified threshold.

24. A method that facilitates expanding upon an existing universal serial bus (USB), comprising:
   vertically stacking at least two expansion modules onto a backside of a base component via at least one snap-foot without having an intervening cable between the base component and an expansion module, and without having an intervening cable between the at least two expansion modules, wherein the base component has a USB port;
   replicating the USB port on each of the at least two expansion modules, wherein the USB port and replicated USB ports are daisy-chained; and
   preventing stacking an additional expansion module to a last expansion module in the stack when power draw from the stack is within a threshold range by employing an key mechanism, wherein the keying mechanism is a connector that is turned to an orientation that prevents stacking the additional expansion module.

25. The method of claim 24, further comprising:
   monitoring a total power draw from the stack;
   denying power to one or more expansion modules added to the stack that result in the total power draw exceeding a power limit.

26. The method of claim 24, the base component is a base product, a base product employing at least one USB port, a base human machine interface (HMI) terminal, a panel, a panel view.

27. The method of claim 24, the device connectivity is related to at least one of a keyboard, a mouse, an input device, a hard drive, a pen drive, a speaker, a device cable, a battery backup, a media player, a tablet, or a device employing a USB connection.

28. A computer-implemented system that facilitates expanding upon an existing universal serial bus (USB), comprising:
   means for including a USB host that provides connectivity to at least one device on a base terminal human machine interface (HMI);
   means for physically connecting a plurality of expansion modules in a vertical stack to a backside of the base terminal HM! without having an intervening cable between the base component and an expansion module, and without having an intervening cable between the plurality of expansion modules, wherein each expansion module replicates the USB host, wherein the USB host and replicated USB hosts are daisy-chained; and
   means for managing power draw of the stack by employing a keying mechanism that is adjustable to physically prevents adding additional expansion modules to the stack that would result in a total power draw of the stack exceeding the power threshold, wherein the keying mechanism is a connector that is turned to an orientation that prevents stacking the additional expansion module.

* * * * *